United States Patent
Teshima

(10) Patent No.: US 10,906,305 B2
(45) Date of Patent: Feb. 2, 2021

(54) LIQUID EJECTION HEAD

(71) Applicant: CANON KABUSHIKI KAISHA, Tokyo (JP)

(72) Inventor: Takayuki Teshima, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/543,317

(22) Filed: Aug. 16, 2019

(65) Prior Publication Data

US 2020/0070512 A1  Mar. 5, 2020

(30) Foreign Application Priority Data

Sep. 5, 2018 (JP) .................................. 2018-165778

(51) Int. Cl.
| | |
|---|---|
| *B41J 2/14* | (2006.01) |
| *H01L 21/3205* | (2006.01) |
| *H01L 27/00* | (2006.01) |
| *H01L 23/52* | (2006.01) |
| *B41J 2/16* | (2006.01) |
| *B41J 2/045* | (2006.01) |

(52) U.S. Cl.
CPC .......... *B41J 2/14072* (2013.01); *B41J 2/045* (2013.01); *B41J 2/16* (2013.01); *H01L 21/3205* (2013.01); *H01L 23/52* (2013.01); *H01L 27/00* (2013.01); *B41J 2202/13* (2013.01)

(58) Field of Classification Search
CPC . B41J 2/045; B41J 2/14072; B41J 2/16; B41J 2202/13; H01L 21/3205; H01L 23/52; H01L 27/00
See application file for complete search history.

(56) References Cited

U.S. PATENT DOCUMENTS

| | | | |
|---|---|---|---|
| 9,751,301 B2* | 9/2017 | Takahashi | ............ B41J 2/04511 |
| 2001/0007460 A1* | 7/2001 | Fujii | .................... B41J 2/04541 |
| | | | 347/54 |
| 2002/0027576 A1* | 3/2002 | Yamanaka | ........... B41J 2/14314 |
| | | | 347/54 |
| 2012/0229553 A1* | 9/2012 | Owaki | ..................... B41J 2/055 |
| | | | 347/19 |

FOREIGN PATENT DOCUMENTS

| | | |
|---|---|---|
| JP | 2007-296775 A | 11/2007 |
| JP | 2011-159869 A | 8/2011 |

* cited by examiner

*Primary Examiner* — Anh T Vo
(74) *Attorney, Agent, or Firm* — Canon U.S.A., Inc. I.P. Division

(57) ABSTRACT

A liquid ejection head includes, a multilayer wiring layer having a plurality of wiring layers laid one on the other and an insulating layer enveloping the plurality of wiring layers, an ejection orifice forming member arranged on one of the oppositely disposed surfaces of the multilayer wiring layer and having an ejection orifice formed therethrough to eject liquid and a through-hole electrode arranged in a through hole running through the multilayer wiring layer between the one and the other surfaces of the multilayer wiring layer. The plurality of wiring layers includes a first wiring layer having a surface located closest to the ejection orifice forming member and the through-hole electrode is held in contact with at least one surface of the plurality of wiring layers different from the surface of the first wiring layer and is electrically connected to the plurality of wiring layers.

20 Claims, 4 Drawing Sheets

LIQUID EJECTION HEAD

BACKGROUND OF THE INVENTION

Field of the Invention

The present disclosure relates to a liquid ejection head.

Description of the Related Art

Liquid ejection heads designed to eject ink from one or more than one ejection orifices and record an image on a recording medium are known. Liquid that is ejected from such a liquid ejection head is not limited to color material ink or inks for recording an image on a sheet of recording paper but includes metal inks to be used for device wiring and reagents to be used for DNA diagnoses. In recent years, there has been and still is a strong demand for high quality image recording to liquid ejection heads. More specifically, liquid ejection heads have been and being required to highly accurately hit a target at a desired position on a recording medium with one or more liquid droplets. For the purpose of improving the accuracy of hitting the target with a liquid droplet or droplets, it is preferable to make the distance between the so-called ejection orifice surface where ejection orifice is or ejection orifices are arranged of a liquid ejection head and the recording medium as short as possible.

However, when a bonding wire is employed for the wiring for supplying electric signals and electric power to the energy generating element or elements of a liquid ejection head (see Japanese Patent Application Laid-Open No. 2007-296775), the distance between the ejection orifice surface or surfaces and the recording medium cannot be reduced beyond a limit. More specifically, the bonding wire and the sealing material for protecting the bonding wire from ink project from the ejection orifice surface toward the recording medium and hence it is necessary to secure a minimal distance between the ejection orifice surface and the recording medium in order to prevent the bonding wire and the sealing material from interfering with the recording medium. In view of this minimal distance situation, techniques of using a through-hole electrode (an electrode that runs through a substrate) that are being adopted for three-dimensional mounting technologies have been proposed to replace the use of a bonding wire. Japanese Patent Application Laid-Open No. 2011-159869 describes a technique of routing the uppermost wiring layer of the multilayer wiring layer arranged on the surface of a semiconductor substrate to the rear surface of the semiconductor substrate by means of a through-hole electrode.

When applying a through-hole electrode to a liquid ejection head, it is required to protect the through-hole electrode from liquid and minimize the increase in the wiring resistance of the through-hole electrode.

SUMMARY OF THE INVENTION

An aspect of the present disclosure is to provide a liquid ejection head that can minimize the increase in the wiring resistance of the through-hole electrode employed in the liquid ejection head, while securing a high reliability for the sealing of the through-hole electrode.

According to the present disclosure, the above-described object is achieved by providing a liquid ejection head including, a multilayer wiring layer having a plurality of wiring layers laid one on the other and an insulating layer enveloping the plurality of wiring layers, an ejection orifice forming member arranged on one of the oppositely disposed surfaces of the multilayer wiring layer as viewed in the layering direction of the plurality of wiring layers and having an ejection orifice formed therethrough to eject liquid, and a through-hole electrode arranged in a through hole running through the multilayer wiring layer between the one surface and the other of the oppositely disposed surfaces of the multilayer wiring layer, wherein the plurality of wiring layers includes a first wiring layer having a closest surface located closest to the ejection orifice forming member as viewed in the layering direction, and the through-hole electrode is held in contact with at least one surface of the plurality of wiring layers different from the closest surface of the first wiring layer and is electrically connected to the plurality of wiring layers.

Thus, with a liquid ejection head according to the present disclosure and having the above-described configuration, the through-hole electrode can be made thick to reduce the wiring resistance without allowing the through-hole electrode to project from the surface of the multilayer wiring layer facing the ejection orifice forming member.

Further features of the present disclosure will become apparent from the following exemplary embodiments with reference to the attached drawings.

DESCRIPTION OF THE EMBODIMENTS

Now, currently preferred embodiments of the present invention will be described below by referring to the accompanying drawings. Throughout the drawings, the same components are denoted respectively by the same reference symbols and will not be described repeatedly. Note that the dimensions, the materials, the profiles and other factors of the components of the embodiments that are described hereinafter are only exemplar ones and do not limit the scope of the present invention by any means.

First Embodiment

Figure 1A:
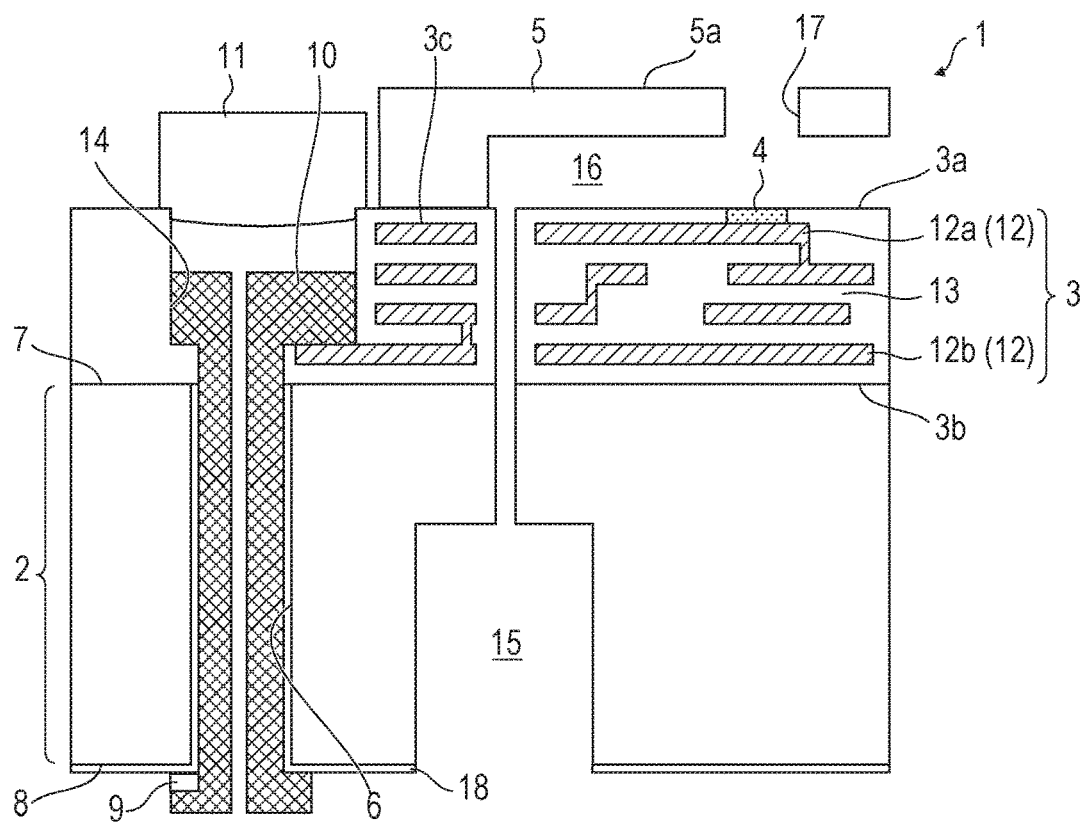
FIGS. 1A and 1B are schematic cross-sectional views of the first embodiment of liquid ejection head according to the present disclosure.
Figure 1B:
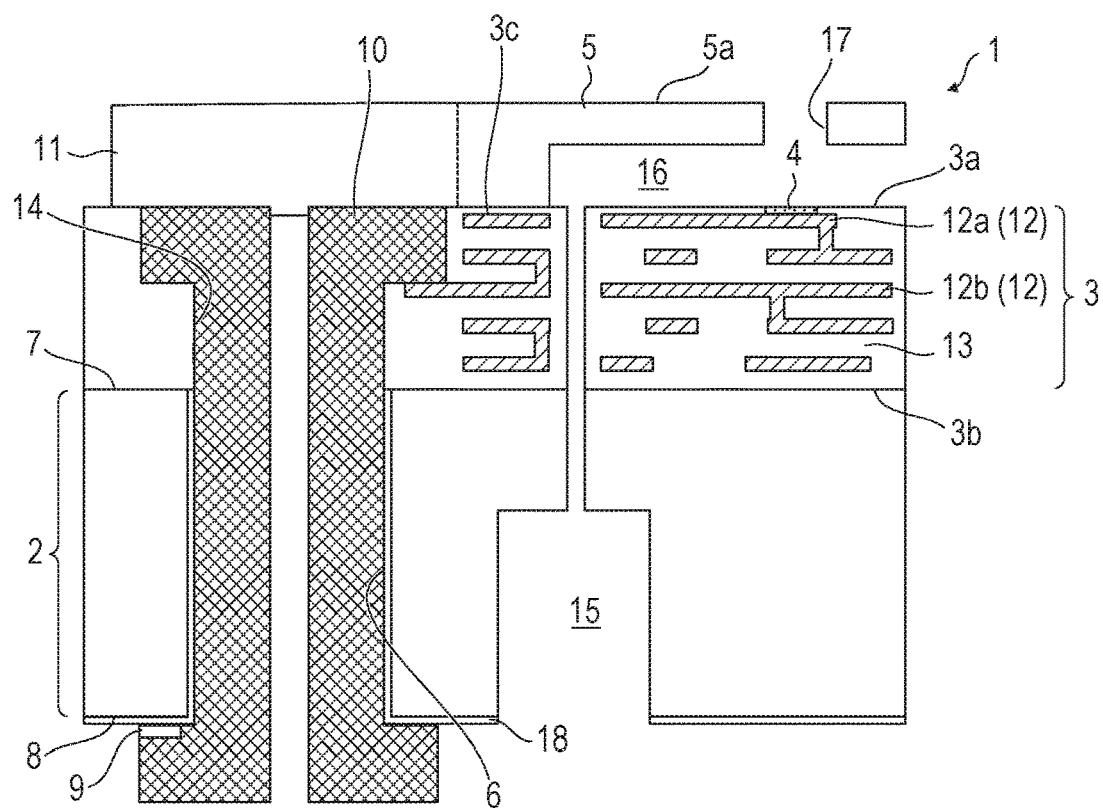
Figure 2A:
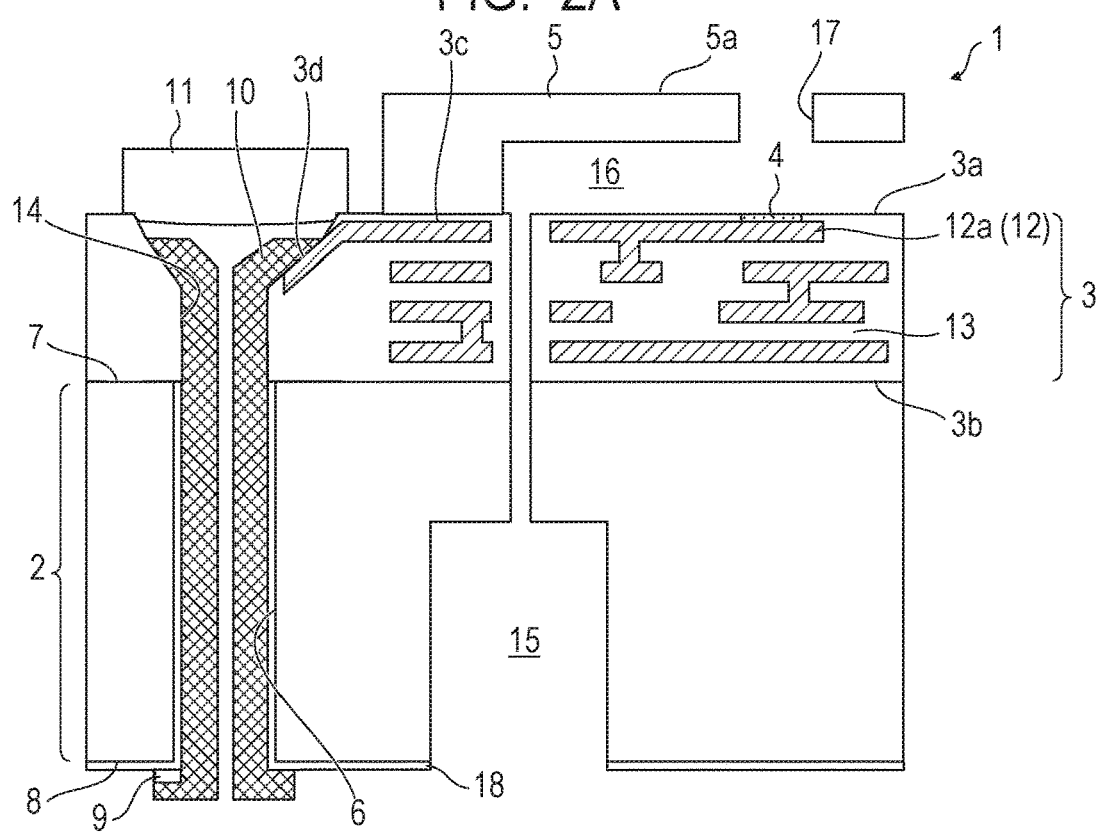
FIGS. 2A and 2B are schematic cross-sectional views of the first embodiment of liquid ejection head according to the present disclosure.
Figure 2B:
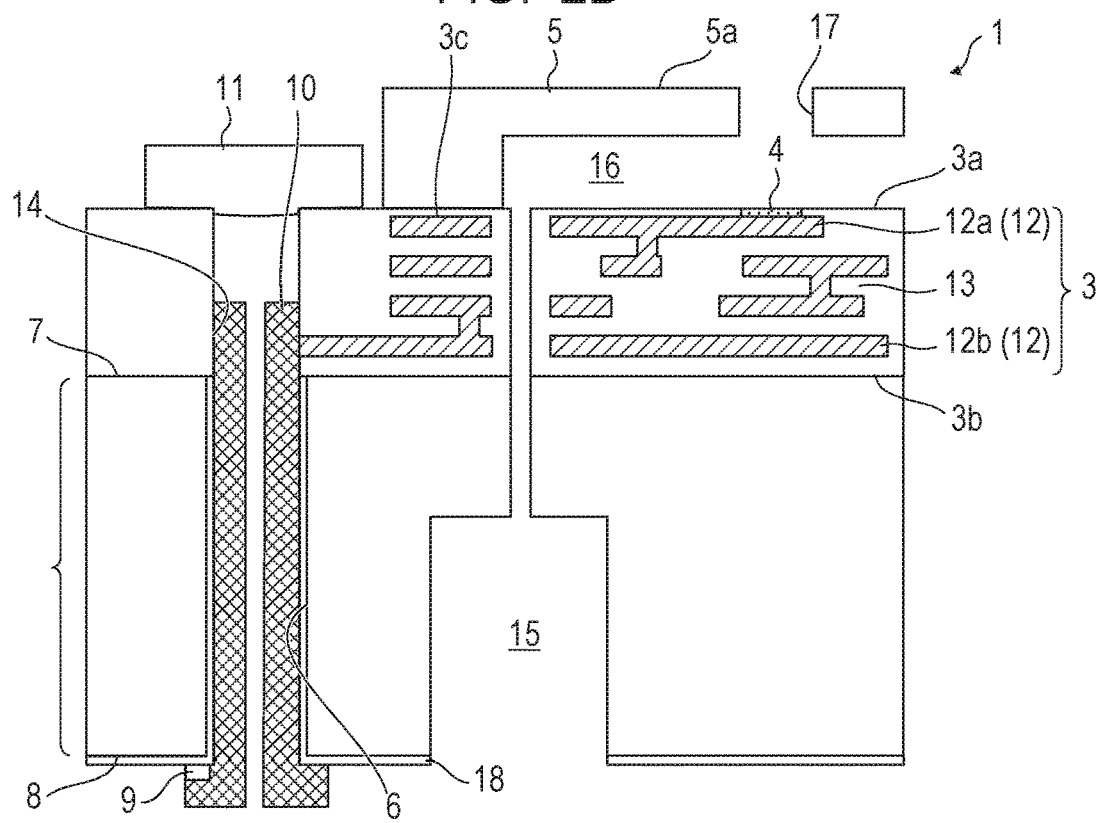

FIG. 1A is a schematic cross-sectional view of the first embodiment of liquid ejection head according to the present disclosure, showing a first configuration example thereof and FIG. 1B is a schematic cross-sectional view of the first embodiment, showing a second configuration example thereof. FIG. 2A is a schematic cross-sectional view of the first embodiment, showing a third configuration example thereof and FIG. 2B is a schematic cross-sectional view of the first embodiment, showing a fourth configuration example thereof. Before describing these configuration examples of the first embodiment of liquid ejection head 1, the components of the first embodiment that are common to all of these configuration examples will be described first.

The liquid ejection head 1 comprises a substrate 2, a multilayer wiring layer 3, an ejection orifice forming member 5, an energy generating element 4, a through-hole electrode 10 and a sealing material 11.

The substrate 2 has an upper surface 7 and a lower surface 8 and the multilayer wiring layer 3 is arranged on the side of the upper surface 7. Note that, for the sake of convenience, the side of the ejection orifice forming member 5 where an ejection orifice surface 5a is located is referred to as upper side and the side opposite to the ejection orifice surface 5a, which is the side located close to the surface (lower surface 8) of the substrate 2, is referred to as lower side in this specification but these expressions of upper side and lower side has nothing to do with the attitude of the liquid ejection head. In this embodiment, the substrate 2 is made of silicon. While the substrate 2 may be made not of silicon but of glass, quartz, ceramic or some other material, the use of silicon is preferable because a plurality of etched micro holes, transistors and heaters can be produced in the substrate 2 by means of semiconductor processing technologies and micro electro-mechanical systems (MEMS) technologies. The substrate 2 is provided with a supply path 15 for supplying liquid to flow path 16 and a substrate through hole 6 that runs through the substrate 2.

An electrode pad 9 is arranged on the lower surface 8 of the substrate 2 with an insulating layer 18 interposed between the substrate 2 and the electrode pad 9. The electrode pad 9 is electrically connected to a drive power supply (not shown) for supplying electric signals and electric power to the energy generating element 4. Any of various popular techniques such as wire bonding, low temperature bonding using low melting point solder or silver paste or the use of anisotropic conductive film (ACF) can be used to connect the electrode pad 9 and the drive power supply. An insulating layer 18 is provided when the substrate 2 is a semiconductor (silicon) substrate as in the instance of this embodiment or when the substrate 2 has an electro-conductive surface.

The multilayer wiring layer 3 has a plurality of wiring layers 12 and a plurality of insulating layers 13 that are alternately laid one on the other. The plurality of wiring layers 12 may electrically be connected to each other by way of the through hole formed through the insulating layers 13. The insulating layers 13 are arranged respectively on the top and also on the bottom of the plurality of wiring layers 12. A plurality of insulating layers 13 may be laid one above the other among the plurality of wiring layers 12 as viewed in the layering direction. In other words, the multilayer wiring layer 3 may have a structure where a plurality of wiring layers 12 are arranged one above the other in the inside of an insulating layer 13. In this embodiment, the wiring layers 12 are made of aluminum. However, materials other than aluminum that can be used for the wiring layers 12 include metals such as copper, tungsten, tantalum, titanium and chromium and alloys of any of these metals. Materials that can be used for the insulating layers 13 include silicon oxides and silicon nitrides. The technique for forming the insulating layers 13 is not subject to any particular limitations. More specifically, a technique selected from various techniques such as CVD (chemical vapor-phase growth), ALD (atomic layer deposition), sputtering, thermal oxidation, evaporation and sol-gel can be used for forming the insulating layers 13. The multilayer wiring layer 3 additionally has barrier layers for minimizing diffusion of the material of the wiring layers 12 into the insulating layers 13. Materials that can be used for the barrier layers include titanium, titanium compounds such as TiN and TiW and silicon compounds such as SiC, SiOC, SiCN, SiOCN and SiON. A wiring layer through hole 14 that runs through the multilayer wiring layer 3 and communicates with the substrate through hole 6 is formed through the multilayer wiring layer 3.

The ejection orifice forming member 5 is arranged on the top surface 3a of the multilayer wiring layer 3 and hence on the side of the multilayer wiring layer 3 opposite to the side thereof facing the substrate 2. An ejection orifice 17 for ejecting liquid and a flow path 16 that communicates with the ejection orifices 17 and also with the supply path 15 of the substrate 2 are formed in the ejection orifice forming member 5. In this embodiment, the ejection orifice forming member 5 is made of a resin material. When the ejection orifice forming member 5 is made of a photosensitive resin material, the ejection orifice forming member 5 can be made to accurately show a designed profile by way of exposure and development processes. Materials other than resin materials that can be used for the ejection orifice forming member 5 include metals provided that the metal selected for it is resistant to the liquid to be ejected from the ejection orifice 17. When the ejection orifice forming member 5 is made of metal, the ejection orifice forming member 5 and the through-hole electrode 10 are electrically insulated from each other. The thickness of the ejection orifice forming member 5 is preferably not greater than 40 μm and more preferably not greater than 20 μm from the viewpoint of liquid refilling. Most preferably, the thickness of the ejection orifice forming member 5 is not greater than 10 μm.

The energy generating element 4 is for generating energy to be used to eject liquid. In this embodiment, the energy generating element 4 is an electrothermal transducer (heater). The energy generating element 4 is arranged at a position located vis-à-vis the ejection orifice 17 of the multilayer wiring layer 3 and electrically connected to the uppermost wiring layer 12a. A protective film that is resistant to the liquid ejected from the ejection orifice 17 is arranged on the energy generating element 4 and also on the wiring (not shown) for electrically connecting the energy generating element 4. Materials that can be used for the protective film include silicon compounds such as SiO, SiN, SiC, SiOC, SiCN, SiOCN and SiON. A cavitation resistant film typically made of Ta may be arranged on the protective film. The liquid in the flow path 16 can be forced to bubble by the thermal energy generated by the energy generating element 4 and thereby ejected from the ejection orifice 17. Note that a recovery path for recovering the liquid in the flow path 16 may be arranged in the substrate 2 and held in communication with the flow path 16 in order to circulate the liquid ejected from the ejection orifice 17 in the flow path 16.

The through-hole electrode 10 is arranged on the inner surfaces of the through holes 6, 14 so as to run through the substrate 2 and also through at least part of the multilayer wining layer 3 in the direction of layering the plurality of wiring layers 12. The through-hole electrode 10 is electrically connected to the multilayer wiring layer 3 and the electrode pad 9. With this connection arrangement, electric signals and electric power can be supplied from the drive power supply (not shown) to the energy generating element 4 by way of the electrode pad 9, the through-hole electrode 10 and the multilayer wiring layer 3. Note that the electrode pad 9 may be replaced by another multilayer wiring layer arranged under the lower surface 8 of the substrate 2.

The surface of the plurality of wiring layers 12 that is to be connected to the through-hole electrode 10 is other than a closest surface located closest to the ejection orifice forming member 5 as viewed in the layering direction of the plurality of wiring layer 12, that is, the surface other than the uppermost surface 3c of the uppermost wiring layer (the first wiring layer located closest to the ejection orifice forming member 5) 12a. More specifically, the through-hole electrode 10 is connected with the wiring layer (the second wiring layer) 12b other than the uppermost wiring layer 12a (see FIGS. 1A, 1B and 2B) or to the uppermost wiring layer 12a at the surface other than the uppermost surface 3c (see FIG. 2A). With this arrangement, the thickness of the through-hole electrode 10 (the thickness from the inner surfaces of the through holes 6, 14) can be made to be a large one to reduce the wiring resistance without allowing the through-hole electrode 10 to project from the top surface 3a of the multilayer wiring layer 3 (the surface located vis-à-vis the ejection orifice forming member 5).

The only requirement to be met by the through-hole electrode 10 is that it is arranged at least on the inner surfaces of the through holes 6, 14. In other words, the through-hole electrode 10 is not required to fill the inside of the through hole 6, 10. The material of the through-hole electrode 10 may appropriately be determined by taking the desired wiring resistance and the bondability of the through-hole electrode 10 into consideration. The material of the through-hole electrode 10 can be selected at least from gold, copper, nickel, palladium, tin, titanium and chromium. The structure of the through-hole electrode 10 is not limited to a single layer structure and may be made of a plurality of metal layers, one or more of which contain one of the above-listed metals. More specifically, an electro-conductive close contact layer, a diffusion prevention layer, a corrosion prevention layer and a boding layer may be laid one on the other in the above-described order on the inner surfaces of the through holes 6, 14 to form the through-hole electrode 10. When not expensive gold but cheap copper is selected for the material of the through-hole electrode 10, gold needs to be used on the surface of the through-hole electrode 10 from the viewpoint of corrosion resistance and bondability. However, since gold and copper can easily diffuse into each other, nickel is normally placed between them to form a diffusion prevention layer. Generally, a nickel-made diffusion prevention layer can be effective when it has a thickness of several micrometers ($\mu$m). The thickness of the through-hole electrode 10 is not subject to any particular limitations so long as the through-hole electrode 10 does not project from the top surface 3a of the multilayer wiring layer 3 and may appropriately be determined by taking the desired wiring resistance and the bondability of the through-hole electrode 10 into consideration. Note that the expression that "the through-hole electrode 10 does not project from the top surface 3a of the multilayer wiring layer 3" covers both an instance where the through-hole electrode 10 does not project at all from the top surface 3a of the multilayer wiring layer 3 and an instance where the through-hole electrode 10 projects from the top surface 3a of the multilayer wiring layer 3 to such an extent that the projection does not damage the effect of satisfactorily sealing the through-hole electrode 10 by the sealing material 11. For example, the through-hole electrode 10 may project from the top surface 3a of the multilayer wiring layer 3 by not more than 1 $\mu$m.

The profile of the transversal cross section of the substrate through hole 6 and that of the wiring layer through hole 14 are not subject to any particular limitations. In other words, they may be circular, tetragonal or of any other shape. The profile of the longitudinal cross section of the substrate through hole 6 is not subject to any particular limitations either. In other words, it may be of a rectangular shape whose long sides run in parallel with the thickness direction of the substrate 2 as shown in FIG. 1A, or of a tapered shape of gradually reducing its width toward the lower surface of the substrate 2 or of an inversely tapered shape of gradually increasing its width toward the lower surface 8 of the substrate 2. On the other hand, the profile of the longitudinal cross section of the wiring layer through hole 14 is determined on the basis of the form of connection between the through-hole electrode 10 and the multilayer wiring layer 3.

When the substrate 2 is a semiconductor substrate (silicon substrate) as in this embodiment, an insulating layer 18 is arranged also on the inner surface of the substrate through hole 6. While a silicon compound such as $SiO_2$ or SiN, a metal oxide, or an organic resin thin film may be used for the insulating layer 18, the material of the insulating layer 18 is not subject to any particular limitations. A barrier layer may be arranged on the inner surface of the substrate through hole 6 depending on the material of the through-hole electrode 10. A material selected from Ti, TiN, TiW, etc. can be used for the barrier layer.

Because a through hole is formed not only through the substrate 2 but also through the multilayer wiring layer 3 (wiring layer through hole 14) in this embodiment, the multilayer wiring layer 3 has a very small film thickness relative to the diameter of the substrate through hole 6 but no membrane structure is formed there as will be described in greater detail hereinafter. For this reason, if the ejection orifice surface 5a of the ejection orifice forming member 5 is subjected to physical power due to, for example, a wiping operation that will be executed for an operation of recovering the degraded function of the liquid ejection head 1, the risk of damaging the multilayer wiring layer 3 will be minimized.

The sealing material 11 is arranged on the top surface 3a of the multilayer wiring layer 3 so as to block the opening of the wiring layer through hole 14. The sealing material 11 eliminates the risk that the liquid ejected from the ejection orifice 17 contacts the through-hole electrode 10 by way of the wiring layer through hole 14 and secures the insulation of the through-hole electrode 10 relative to liquid. Additionally, since the through-hole electrode 10 does not project from the top surface 3a of the multilayer wiring layer 3 in this embodiment as described above, the sealing material 11 can satisfactorily seal the through-hole electrode 10 and does not hinder any effort of reducing the distance between the ejection orifice surface 5a and the recording medium. In this embodiment, the sealing material 11 is an epoxy resin material and may be formed simultaneously with the formation of the ejection orifice forming member 5. In other words, the sealing material 11 and the ejection orifice forming member 5 may be made of a same and identical material.

However, the sealing material 11 may be made of a material different from the material of the ejection orifice forming member 5 or the ejection orifice forming member 5 may be made to operate also as the sealing material 11 (see FIG. 1B). The sealing material 11 may or may not be held in contact with the through-hole electrode 10.

Now, the first through fourth configuration examples of the liquid ejection head 1 of this embodiment will be described below. The above-described part of the configuration of the liquid ejection head 1 of this embodiment that is common to all of the four configuration examples will not be described repeatedly below. In other words, only the part of each of the four configuration examples that is specific to it will be described below.

With the first configuration example shown in FIG. 1A, a 6 µm-thick multilayer wiring layer 3 is arranged on the top surface 7 of a 625 µm-thick substrate 2. The multilayer wiring layer 3 has four wiring layers 12, each of which is made of aluminum, and $SiO_2$ is arranged to a thickness of 300 µm on the uppermost wiring layer 12a to form an insulating layer 13. A substrate through hole 6 having a diameter of 100 µm is formed through the substrate 2. A wiring layer through hole 14, whose diameter is made to change stepwise in the depth direction, is formed through the multilayer wiring layer 3 so as to expose the top surface of the lowermost wiring layer 12b of the four wiring layers 12. More specifically, the wiring layer through hole 14 has a small diameter part having a diameter of 100 µm on the side of the bottom surface 3b of the multilayer wiring layer 3 and a large diameter part having a diameter of 130 µm on the side of the top surface 3a of the multilayer wiring layer 3. Titanium, copper, nickel and gold are laid in the above-described order to form the through-hole electrode 10 on the inner surface of through holes 6, 14. Thus, the through-hole electrode 10 is electrically connected to the lowermost wiring layer 12b at the upper surface (surface facing the ejection orifice forming member 5) of the lowermost wiring layer 12b. In the through-hole electrode 10, the titanium operates as a close contact layer and the copper operates as an electro-conductive layer, while the nickel operates as a diffusion prevention layer and the gold operates as a layer for enhancing corrosion protection and wire bondability. A 500 nm-thick $SiO_2$ layer is arranged as an insulating layer 18 both on the bottom surface 8 of the substrate 2 and on the inner source of the substrate through hole 6.

With this configuration example, the large diameter part of the wiring layer through hole 14 has a depth of 5 µm and the through-hole electrode 10 has a thickness of 4 µm. Therefore, the upper end surface of the through-hole electrode 10 is located at a position 1 µm below the top surface 3a of the multilayer wiring layer 3 and, since the through-hole electrode 10 does not project from the top surface 3a, the through-hole electrode 10 can satisfactorily be sealed by the sealing material 11. Additionally, the copper layer of the through-hole electrode 10 has a thickness of 1 µm and the wiring resistance of the through-hole electrode 10 is not more than 30 mΩ, which is a low wiring resistance value. Furthermore, with this configuration example, the through-hole electrode 10 is connected to the upper surface of the lowermost wiring layer 12b, which is exposed to the large diameter part of the wiring layer through hole 14, and therefore the contact area of the through-hole electrode 10 and the wiring layer 12b can be increased to reduce the contact resistance by selecting a large diameter value for the large diameter part.

The second configuration example illustrated in FIG. 1B differs from the first configuration example in that the multilayer wiring layer 3 has five wiring layers 12 and its thickness is 8 µm. Of the five wiring layers 12, the upper surface of the third wiring layer 12b as counted from above is exposed to the wiring layer through hole 14. For the through-hole electrode 10, titanium, copper, tin, palladium, nickel and gold are laid one on the other in the above-described order on the inner surface of the through holes 6, 14. Therefore, the through-hole electrode 10 is electrically connected to the third wiring layer 12b at the upper surface (facing toward the ejection orifice forming member 5) of the third wiring layer 12b. Additionally, the ejection orifice forming member 5 operates also as the sealing material 11 and arranged on the top surface 3a of the multilayer wiring layer 3 so as to close the opening of the wiring layer through hole 14. The thickness of the insulating layer 18 is 300 nm, which also differs from the thickness of the insulating layer 18 of the first configuration example.

With this configuration example, the large diameter part of the wiring layer through hole 14 has a depth of 4 µm and the thickness of the through-hole electrode 10 is 4 µm. Therefore, the upper end surface of the through-hole electrode 10 is flush with the top surface 3a of the multilayer wiring layer 3 and, since the through-hole electrode 10 does not project from the top surface 3a, the through-hole electrode 10 can satisfactorily be sealed by the ejection orifice forming member 5. Additionally, while the materials of the through-hole electrode 10 differ from the materials of the through-hole electrode 10 of the first example configuration, the copper layer has a thickness of 1 µm, which is the same as the thickness of the copper layer of the first configuration example, and the wiring resistance of the through-hole electrode 10 is also as low as not more than 30 mΩ.

The third configuration example illustrated in FIG. 2A differs from the first configuration example in that the uppermost wiring layer 12a of the four wiring layers 12 is connected to the uppermost surface 3c and has an inclined surface 3d that is downwardly inclined toward the substrate 2 relative to the uppermost surface 3c thereof. The wiring layer through hole 14 is downwardly tapered and hence its diameter is gradually reduced toward the bottom surface 3b of the multilayer wiring layer 3 so as to expose the inclined surface 3d of the uppermost wiring layer 12a. Thus, the through-hole electrode 10 is electrically connected to the uppermost wiring layer 12a at the inclined surface 3d of the uppermost wiring layer 12a. While the through-hole electrode 10 is electrically connected to the uppermost wiring layer 12a at the inclined surface 3d, the net result that the through-hole electrode 10 can secure a satisfactory thickness and at the same time does not project from the top surface 3a of the multilayer wiring layer 3 of this configuration example is the same as that of the first configuration example.

The fourth configuration example illustrated in FIG. 2B differs from the first configuration example in that the through-hole electrode 10 is electrically connected to the lowermost wiring layer 12b of the four wiring layers 12 at the lateral surface of the lowermost wiring layer 12b. With this configuration example, the wiring layer through hole 14 does not have a stepped structure where the diameter of the wiring layer through hole 14 changes stepwise in the depth direction but has a constant diameter (100 µm). Note, however, that the profile of the longitudinal cross section of the wiring through hole 14 is not limited such one and may alternatively have a tapered profile such that the width of the longitudinal cross section of the wiring through hole 14 is gradually reduced toward the lower surface 3b of the multilayer wiring layer 3 or an inversely tapered profile such that the width of the longitudinal cross section of the wiring through hole 14 is gradually increased toward the lower surface 3b. Additionally, it is sufficient for this configuration example that the through-hole electrode 10 is connected to any one of the four wiring layers 12. For instance, the through-hole electrode 10 may be connected to the uppermost wiring layer 12a at the lateral surface of the uppermost wiring layer 12a.

Second Embodiment

Figure 3A:
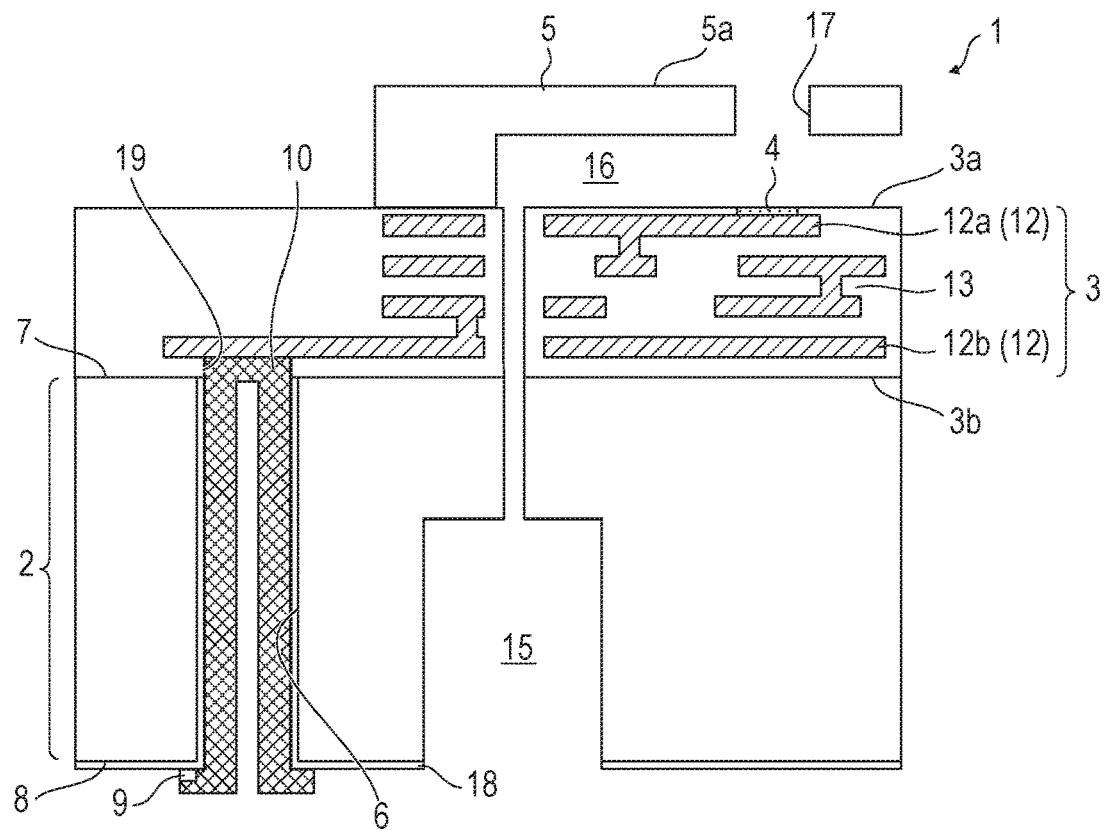
FIGS. 3A and 3B are schematic cross-sectional views of the second embodiment of liquid ejection head according to the present disclosure.
Figure 3B:
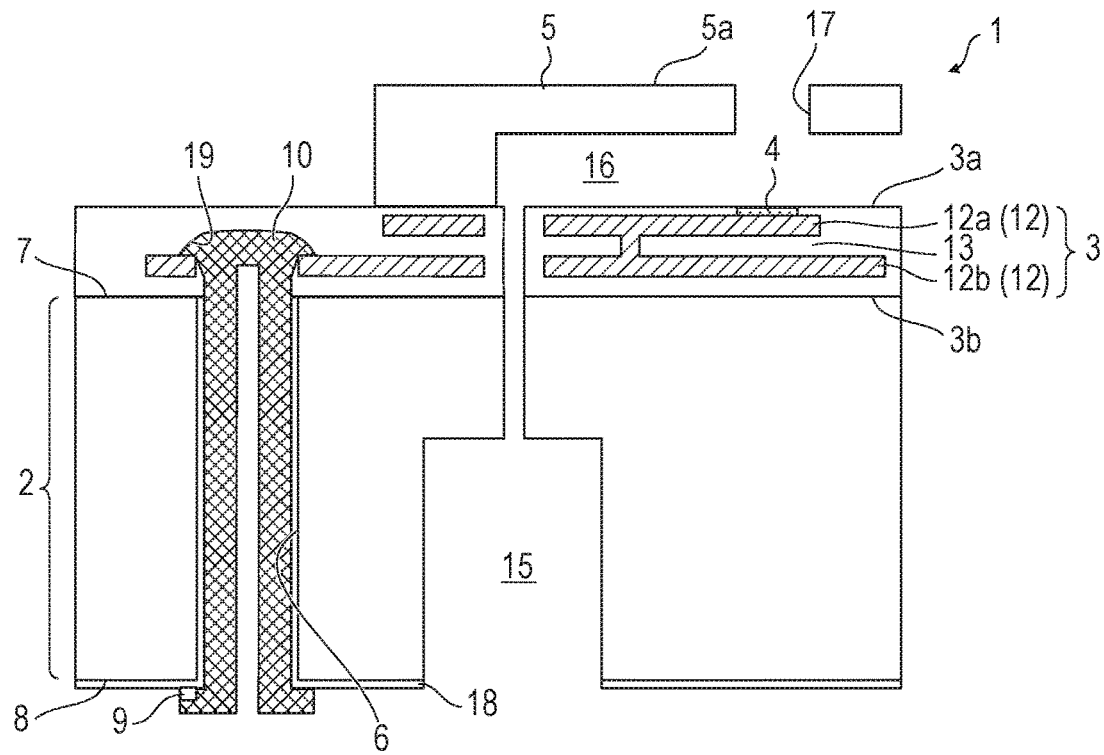

FIG. 3A is a schematic cross-sectional view of the second embodiment of liquid ejection head according to the present disclosure, showing a configuration example thereof and FIG. 3B is also a schematic cross-sectional view of the second embodiment of liquid ejection head according to the present disclosure, showing another configuration example. Note that the parts of the embodiment that are the same as those of the first embodiment will not repeatedly be described below.

This embodiment differs from the first embodiment in that the multilayer wiring layer 3 of this embodiment does not have any through hole (wiring layer through hole 14). More specifically, the multilayer wiring layer 3 of this embodiment has a recess 19 at the lower surface 3*b* thereof (that faces the substrate 2) and the recess 19 is held in communication with the substrate through hole 6. The through-hole electrode 10 is arranged on the inner surface of the substrate through hole 6 and on the inner surface of the recess 19. Therefore, if the thickness (the thickness from the inner surface of the substrate through hole 6 and the inner surface of the recess 19) of the through-hole electrode 10 is increased to reduce the wiring resistance, the through-hole electrode 10 does not project from the top surface 3*a* of the multilayer wiring layer 3 and hence does not contact the liquid ejected from the ejection orifice 17. Then, as a result, no sealing material 11 is provided in this embodiment because no sealing material 11 is required.

With the configuration example illustrated in FIG. 3A, the lower surface (that faces the substrate 2) of the lowermost wiring layer 12*b* is exposed because of the provision of the recess 19 and the through-hole electrode 10 is electrically connected to the lowermost wiring layer 12*b* at the lower surface thereof. Note that, with this configuration example, it is sufficient for the through-hole electrode 10 that the through-hole electrode 10 is electrically connected to any one of the four wiring layers 12. For example, the through-hole electrode 10 may be connected to the uppermost wiring layer 12*a* at the lower surface thereof. Otherwise, this configuration example is the same as the first configuration example of the first embodiment.

With the configuration example illustrated in FIG. 3B, the multilayer wiring layer 3 has two wiring layers 12 and the upper surface (that faces the ejection orifice forming member 5) of the lowermost wiring layer 12*b* is exposed because of the provision of a recess 19 while the through-hole electrode 10 is electrically connected to the lowermost wiring layer 12*b* at that upper surface. Otherwise, this configuration example is the same as the configuration example illustrated in FIG. 3A.

Figure 4A:
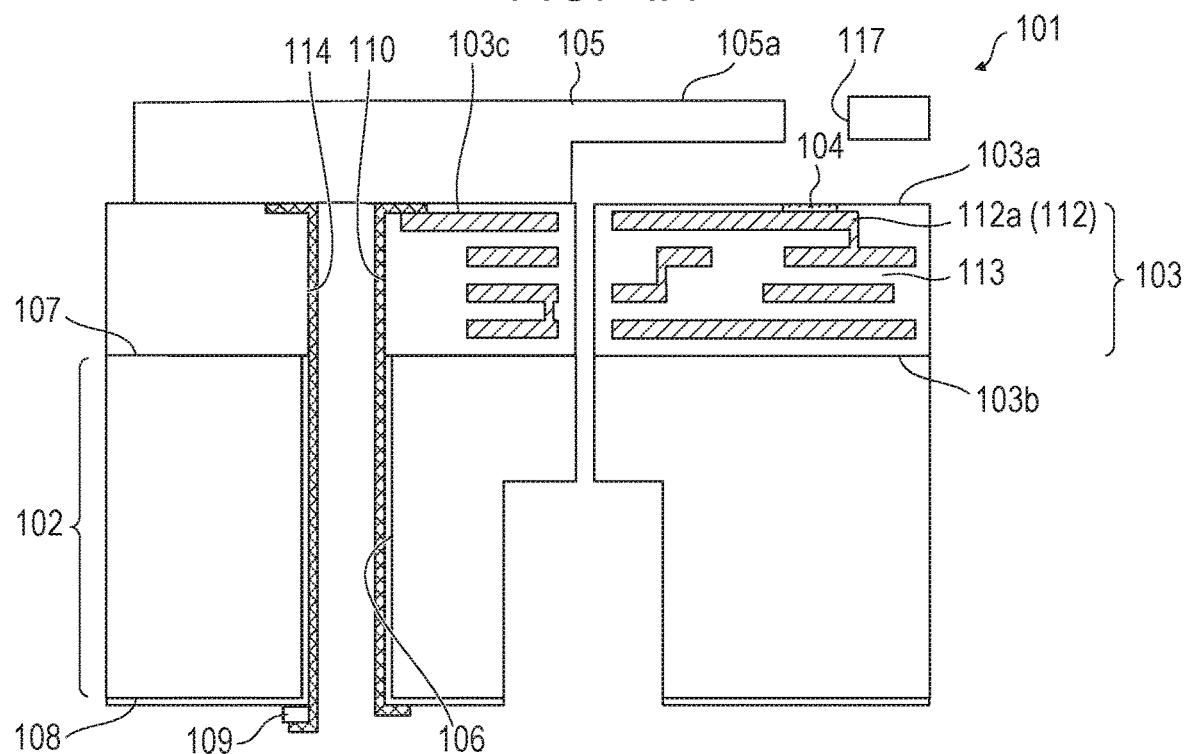
FIGS. 4A and 4B are schematic cross-sectional views of a known liquid ejection head having a through-hole electrode as illustrated for the purpose of comparison.
Figure 4B:
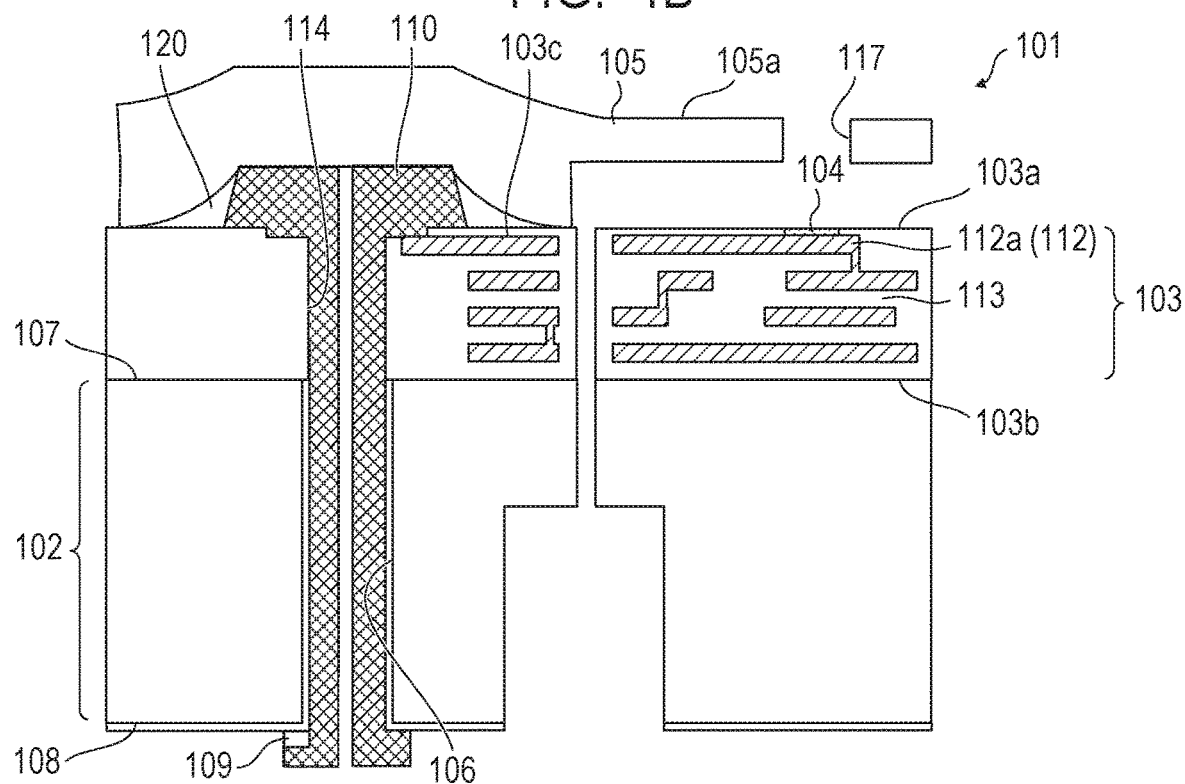

Finally, as comparative examples, instances where the technique described in Japanese Patent Application Laid-Open No. 2011-159869 is applied to a liquid ejection head of the type under consideration will be described below. FIG. 4A is a schematic longitudinal cross-sectional view of a liquid ejection head of the type under consideration, showing an configuration example realized by applying the technique of Japanese Patent Application Laid-Open No. 2011-159869. FIG. 4B is a schematic longitudinal cross-sectional view of another liquid ejection head of the type under consideration, showing another configuration example realized by applying the technique of the above-cited patent application.

Both of the liquid ejection heads 101 illustrated in FIGS. 4A and 4B have a substrate 102, a multilayer wiring layer 103 arranged on the upper surface 107 of the substrate 102 and an ejection orifice forming member 105 arranged on the upper surface 103*a* of the multilayer wiring layer 103. The substrate 102 and the multilayer wiring layer 103 are respectively provided with through holes 106, 114 that run through the substrate 102 and the multilayer wiring layer 103 and a through-hole electrode 110 is arranged on the inner surfaces of the through hole 106, 114. In each of the comparative examples, the through-hole electrode 110 is electrically connected to the uppermost wiring layer 112*a* of the plurality of wiring layers 112 of the multilayer wiring layer 103 on the upper surface 103*c* of the uppermost wiring layer 112*a*. The through-hole electrode 110 is also electrically connected to the electrode pad 109 arranged on the lower surface 108 of the substrate 102 and the electrode pad 109 is in turn electrically connected with a drive power supply (not shown). With the above-described arrangement, electric signals and electric power can be supplied from the drive power supply to the energy generating element 104 by way of the electrode pad 109, the through-hole electrode 110 and the uppermost wiring layer 112*a*. Additionally, the through-hole electrode 110 is sealed by the ejection orifice forming member 105 so that the through-hole electrode 110 may not contact the liquid ejected from the ejection orifice 117.

With the configuration of the comparative example illustrated in FIG. 4A, an insulating layer 113 having a thickness of, for example, 0.3 µm is arranged on the upper surface 103*c* of the uppermost wiring layer 112*a* and a through-hole electrode 110 having a thickness of 0.3 µm, which corresponds to the thickness of the insulating layer 113, is arranged on the inner surfaces of the through holes 106, 114 having a diameter of 100 µm. While the reliability of sealing the through-hole electrode 110 of this instance is secured because the through-hole electrode 110 does not project from the upper surface 103*a* of the multilayer wiring layer 103, a high wiring resistance that is not lower than 100 mΩ appears because the through-hole electrode 110 has a thickness that is as small as 0.3 µm.

With the configuration of the comparative example illustrated in FIG. 4B, on the other hand, a through-hole electrode 110 having a thickness of 4 µm is arranged on the inner surfaces of the through holes 106, 114 having a diameter of 100 µm. While the through-hole electrode 110 of this comparative example is made thicker than the through-hole electrode 110 of the comparative example illustrated in FIG. 4A and hence the wiring resistance is reduced to not higher than 30 mΩ for this reason, the through-hole electrode 110 projects from the upper surface 103*a* of the multilayer wiring layer 103 by as much as 3.7 µm. Then, as a result, a gap 120 is produced between the through-hole electrode 110 and the ejection orifice forming member 105 that seals the through-hole electrode 110 to remarkably damage the reliability of the effect of sealing the through-hole electrode 110. Furthermore, when the through-hole electrode 110 projects remarkably from the upper surface 103*a* of the multilayer wiring layer 103, it hinders the effort of reducing the distance between the ejection orifice surface 105*a* and the recording medium to be used for recording an image thereon.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-165778, filed Sep. 5, 2018, which is hereby incorporated by reference herein in its entirety.

What is claimed is:
1. A liquid ejection head comprising:
  a multilayer wiring layer having a plurality of wiring layers and a plurality of insulating layers alternatingly stacked in a layering direction with the outermost layers being insulating layers;

an ejection orifice forming member arranged on a first outermost surface of the multilayer wiring layer having an ejection orifice formed therethrough to eject liquid; and a through-hole electrode arranged in a through hole running through the multilayer wiring layer between the first outermost surface and a second outermost surface of the multilayer wiring layer opposite to the first outermost surface, wherein the plurality of wiring layers includes a first wiring layer having a closest surface located closest to the ejection orifice forming member in the layering direction, wherein the through-hole electrode is held in contact with at least one surface of the plurality of wiring layers different from the closest surface of the first wiring layer and is electrically connected to the plurality of wiring layers, and wherein the through-hole electrode is connected to a drive power supply that supplies at least one of electric signals and electric power.

2. The liquid ejection head according to claim 1, wherein the through-hole electrode is arranged in the through hole so as not to project from the first outermost surface of the multilayer wiring layer.

3. The liquid ejection head according to claim 2, wherein the plurality of wiring layers include a second wiring layer that is different from the first wiring layer and the through-hole electrode is electrically connected to the second wiring layer at a surface of the second wiring layer facing the ejection orifice forming member.

4. The liquid ejection head according to claim 3, wherein the through hole of the multilayer wiring layer has a diameter that changes stepwise in the depth direction so as to expose the surface of the second wiring layer facing the ejection orifice forming member.

5. The liquid ejection head according to claim 2, further comprising:

a substrate arranged on the second outermost surface of the multilayer wiring layer, wherein the first wiring layer has an inclined surface inclined from the surface located close to the ejection orifice forming member toward the substrate, wherein the through-hole electrode is electrically connected to the first wiring layer at the inclined surface.

6. The liquid ejection head according to claim 2, wherein the plurality of wiring layers include a second wiring layer that is different from the first wiring layer and the through-hole electrode is electrically connected either to the first wiring layer at a lateral surface of the first wiring layer or to the second wiring layer at a lateral surface of the second wiring layer.

7. The liquid ejection head according to claim 2, wherein the ejection orifice forming member is arranged so as to close an opening of the through hole at the first outermost surface of the multilayer wiring layer.

8. The liquid ejection head according to claim 2, further comprising:

a sealing material formed of the same material as the ejection orifice forming member and arranged so as to close an opening of the through hole at the first outermost surface of the multilayer wiring layer.

9. The liquid ejection head according to claim 2, wherein the through-hole electrode is composed of a plurality of metal layers formed on the inner surface of the through hole.

10. The liquid ejection head according to claim 1, further comprising:

a substrate arranged on the second outermost surface of the multilayer wiring layer, the through hole running through the substrate and the multilayer wiring layer.

11. The liquid ejection head according to claim 10, wherein the substrate is made of silicon.

12. The liquid ejection head according to claim 11, further comprising an insulating layer arranged between the substrate and the through-hole electrode.

13. The liquid ejection head according to claim 10, further comprising:

an electrode pad provided on the surface opposite to the side where the multilayer wiring layer is provided, the electrode pad being electrically connected to the trough-hole electrode.

14. The liquid ejection head according to claim 1, further comprising:

an energy generating element for generating energy to be used to eject liquid, the energy generating element being arranged on the multilayer wiring layer at a position located vis-à-vis the ejection orifice.

15. The liquid ejection head according to claim 1, wherein the through-hole electrode comprises at least a metal selected from gold, copper, nickel, palladium, tin, titanium and chromium.

16. The liquid ejection head according to claim 1, further comprising:

an energy generating element for generating energy to be used to eject liquid, the energy generating element being electrically connected to the trough-hole electrode.

17. A liquid ejection head comprising:

a multilayer wiring layer having a plurality of wiring layers and a plurality of insulating layers alternatingly stacked in a layering direction with the outermost layers being insulating layers;

an ejection orifice forming member arranged on a first outermost surface of the multilayer wiring layer having an ejection orifice formed therethrough to eject liquid; and a through-hole electrode arranged in a through hole running through the multilayer wiring layer between the first outermost surface and a second outermost surface of the multilayer wiring layer opposite to the first outermost surface, wherein the plurality of wiring layers includes a first wiring layer and a second wiring layer located remoter from the ejection orifice forming member than the first wiring layer in the layering direction, wherein the through-hole electrode is held in contact with the second wiring layer and is electrically connected to the plurality of wiring layers, and wherein the through-hole electrode is connected to a drive power supply that supplies at least one of electric signals and electric power.

18. The liquid ejection head according to claim 17, wherein the through-hole electrode is arranged in the through hole so as not to project from the first outermost surface of the multilayer wiring layer.

19. The liquid ejection head according to claim 18, wherein
the through-hole electrode is electrically connected to the second wiring layer at a surface of the second wiring layer facing the ejection orifice forming member.

20. The liquid ejection head according to claim 19, wherein
the through hole of the multilayer wiring layer has a diameter that changes stepwise in the depth direction so as to expose the surface of the second wiring layer facing the ejection orifice forming member.

* * * * *